(12) United States Patent
Dong et al.

(10) Patent No.: US 12,363,858 B2
(45) Date of Patent: Jul. 15, 2025

(54) DEVICES, SYSTEMS, AND METHODS FOR A COOLING SYSTEM

(71) Applicant: Microsoft Technology Licensing, LLC, Redmond, WA (US)

(72) Inventors: Fang Dong, Issaquah, WA (US); Meng Jin, Sammamish, WA (US); Jigar Mehta, Redmond, WA (US); Mayila Babang, Redmond, WA (US); Michele Alberto Scipione Treves, Mercer Island, WA (US); Martha Geoghegan Peterson, Woodinville, WA (US); Linjie Xu, Sammamish, WA (US); Naval Gupta, Redmond, WA (US); Hyunjung Cho, Peachtree City, GA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 105 days.

(21) Appl. No.: 17/968,619

(22) Filed: Oct. 18, 2022

(65) Prior Publication Data

US 2024/0130078 A1    Apr. 18, 2024

(51) Int. Cl.
*H05K 7/20* (2006.01)
*G06F 1/20* (2006.01)

(52) U.S. Cl.
CPC .......... *H05K 7/20272* (2013.01); *G06F 1/20* (2013.01); *H05K 7/20236* (2013.01); *H05K 7/20763* (2013.01)

(58) Field of Classification Search
CPC .......... H05K 7/20272; H05K 7/20236; H05K 7/20763; G06F 1/20

USPC ....................................................... 361/679.53
See application file for complete search history.

(56) References Cited

U.S. PATENT DOCUMENTS

| | | | | |
|---|---|---|---|---|
| 4,302,793 A * | 11/1981 | Rohner | .............. | H05K 7/20272 361/689 |
| 4,619,316 A * | 10/1986 | Nakayama | ............ | F28F 13/187 257/713 |
| 4,949,164 A * | 8/1990 | Ohashi | ................... | H01L 23/427 165/80.4 |
| 5,004,973 A * | 4/1991 | Taraci | .................... | G05D 23/01 165/80.4 |
| 5,297,621 A * | 3/1994 | Taraci | .................... | H05K 7/203 324/750.08 |
| 8,619,425 B2 * | 12/2013 | Campbell | .............. | H05K 7/203 361/689 |
| 8,953,317 B2 * | 2/2015 | Campbell | ............. | F28D 1/0477 361/689 |
| 9,328,964 B2 * | 5/2016 | Shelnutt | ............ | H05K 7/20318 |

(Continued)

OTHER PUBLICATIONS

International Search Report and Written Opinion received for PCT Application No. PCT/US2023/031805, Dec. 4, 2023, 14 pages.

(Continued)

*Primary Examiner* — Anatoly Vortman
(74) *Attorney, Agent, or Firm* — RAY QUINNEY & NEBEKER P.C.; Paul N. Taylor

(57) ABSTRACT

A cooling system may include a tank filled with a first cooling fluid. The cooling system may include a container including a chamber, the chamber receiving a heat-generating component, the container being sealed, the container being at least partially submerged in the first cooling fluid in the tank, the container including a second cooling fluid.

18 Claims, 5 Drawing Sheets

(56) References Cited

U.S. PATENT DOCUMENTS

| | | | |
|---|---|---|---|
| 10,485,137 B2 * | 11/2019 | Helsel | G06F 1/20 |
| 10,645,841 B1 * | 5/2020 | Mao | H05K 7/20781 |
| 10,782,751 B1 * | 9/2020 | Gauthier | F24D 17/0042 |
| 11,032,941 B2 * | 6/2021 | Le | H05K 7/20272 |
| 11,744,043 B2 * | 8/2023 | Gao | H05K 7/203 |
| | | | 361/679.53 |
| 2017/0265336 A1 * | 9/2017 | Ichinose | H05K 7/20772 |
| 2017/0290205 A1 * | 10/2017 | Shepard | H05K 7/20936 |
| 2018/0255661 A1 | 6/2018 | Helsel et al. | |
| 2018/0246550 A1 | 8/2018 | Inaba et al. | |
| 2019/0223324 A1 * | 7/2019 | Le | H05K 7/20263 |

OTHER PUBLICATIONS

International Preliminary Report on Patentability received for PCT Application No. PCT/US23/031805, May 1, 2025, 09 pages.

* cited by examiner

DEVICES, SYSTEMS, AND METHODS FOR A COOLING SYSTEM

CROSS-REFERENCE TO RELATED APPLICATIONS

N/A.

BACKGROUND

Computing devices can generate a large amount of heat during use. The computing components can be susceptible to damage from the heat and commonly require cooling systems to maintain the component temperatures in a safe range during heavy processing or usage loads. Different computing demands and applications produce different amounts of thermal energy and require different amounts of thermal management.

BRIEF SUMMARY

In some aspects, the techniques described herein relate to a cooling system for a computing device. The cooling system includes a tank filled with a first cooling fluid and a container including a chamber. The chamber receives a heat-generating component. The container is sealed. The container is at least partially submerged in the first cooling fluid in the tank. The container includes a second cooling fluid.

In some aspects, the techniques described herein relate to a cooling system. The computing device includes at least one heat-generating component. A tank is filled with a first cooling fluid. A container includes a chamber. The chamber is at least partially filled with a second cooling fluid. The tank is at least partially submerged in the first cooling fluid. A computing device is located in the container. The computing device is at least partially submerged in the second cooling fluid.

In some aspects, the techniques described herein relate to a method for cooling a computing device. The method includes submerging a computing device at least partially in a second cooling fluid. The second cooling fluid is located in a container. The second cooling fluid and the computing device are sealed in the container. The container is submerged in a first cooling fluid, the first cooling fluid being located in a tank.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which.

DETAILED DESCRIPTION

Figure 1:
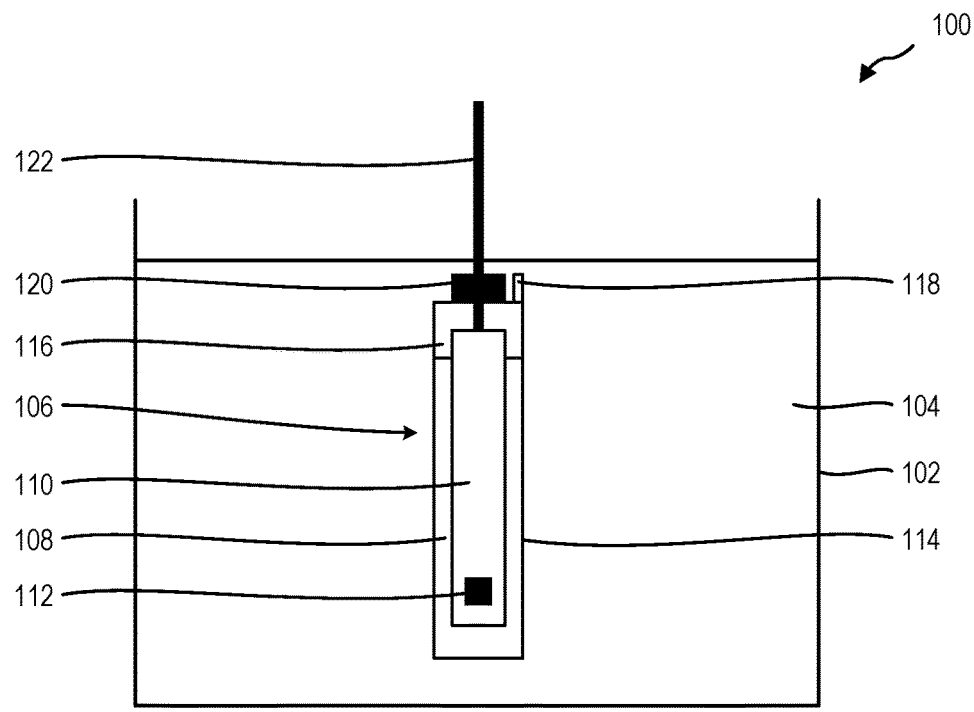
FIG. 1 is a representation of a cooling system, according to at least one embodiment of the present disclosure.

This disclosure generally relates to devices, systems, and methods for cooling a computing device. Computing devices, including processors and other elements, generate heat during operation. This may raise the temperature of the computing device. If the temperature of the computing device raises too high, then the computing device may experience decreased performance and/or damage. To reduce the temperature of the computing device, a computing device may include a cooling system. A cooling system may utilize a fluid to absorb the generated heat and transfer the heat away from the computing device.

In some situations, the computing device may be at least partially submerged in a cooling fluid. The cooling fluid may directly contact the heat-generating components of the computing device. The cooling fluid may be a dielectric fluid, or a fluid that does not conduct electricity. This may help to prevent damage to the circuitry of the computing device based caused by shorts in the circuitry through the cooling fluid. In some situations, the cooling fluid may be designed with a specific boiling point. For example, the boiling point of the cooling fluid may be based on the operating temperature of the computing device.

In some situations, cooling fluids that have the particular properties for use in an immersion cooling system may present a health and safety risk for human operators exposed to them. For example, the immersion cooling fluids may be harmful to an operator if the cooling fluid comes into contact with the operator's skin, if the operator ingests a portion of the cooling fluid, if the operator inhales vapors from the cooling fluid, the operator otherwise contacts the cooling fluid, and combinations thereof.

In accordance with at least one embodiment of the present disclosure, a cooling system for a computing device may include container that is at least partially filled with a container cooling fluid. A computing device may be at least partially submerged in the container cooling fluid. During operation of the computing device, the container cooling fluid may cool the processor. The container may be closed with a fluid seal. Put another way, the container may be fluidly sealed. A fluid seal may prevent the container cooling fluid from leaking out of the container during operation. This may help to reduce or prevent contact of the container cooling fluid with an operator, thereby improving the safety of operation of the computing device.

A tank may be filled with a tank cooling fluid. The container may be at least partially submerged in the cooling fluid. As the container cooling fluid absorbs heat from the computing device, the heat may be at least partially transferred to the body of the container. The tank cooling fluid may absorb the heat from the body of the computing device. In this manner, the tank cooling fluid may absorb the heat from the computing device. In accordance with at least one embodiment of the present disclosure, the tank cooling fluid may be any type of fluid having any properties. For example, the tank cooling fluid may be tap water, sea water, lake water, river water, filtered water, or any other water-based fluid. In some examples, the tank fluid may have a boiling point of approximately 100° C. In some examples, the tank cooling fluid may be inert and non-toxic for an operator to handle. The tank cooling fluid may be selected and/or designed to be easy and safe to handle. For example, the tank cooling fluid may be safe for an operator to contact, ingest, inhale, or otherwise contact during operation and/or maintenance of the computing system. In some embodiments, the tank cooling fluid may be safe for the operator to handle without the operator using any personal protective equipment (PPE).

The cooling systems of the present disclosure may allow for the use of a specialized container cooling fluid in the sealed and/or closed system of the container. The container cooling fluid may be designed to be a single-phase or a multi-phase cooling fluid, with working temperatures at or near the operating temperature of the computing device. Submerging the container in the tank cooling fluid may allow the tank cooling fluid to be designed with different properties such as operator safety and/or environmental safety. Because the container is sealed, the container cooling fluid may be contained, thereby reducing losses of the container cooling fluid and reducing or preventing contact of the container cooling fluid with the operator. This may help to reduce the operating cost of the cooling system and/or improve operator safety.

As illustrated by the foregoing discussion, the present disclosure utilizes a variety of terms to describe features and advantages of the hybrid cooling system. Additional detail is now provided regarding the meaning of such terms. For example, as used herein, the term "heat-generating component" refers to any component of a computing system that generates heat. To illustrate, a heat-generating component can include processors, circuits, integrated circuits (ICs), application-specific integrated circuits (ASIC), switches, transistors, field-programmable gate arrays (FPGAs), antennas, receivers, memory, random-access memory (RAM), dynamic random-access memory (DRAM), static random-access memory (SRAM), read-only memory (ROM), dual in-line memory modules (DIMMs), energy storage devices, batteries, supercapacitors, any other heat-generating component, and combinations thereof. A heat-generating component that generates more heat may be associated with a higher-performing heat-generating component. For example, a faster heat-generating component may generate more total heat. In some examples, a smaller heat-generating component may have a higher heat flux, resulting in a higher rate of cooling to maintain operating temperatures.

As used herein, the term "thermally connected" refers to a connection between two components that facilitates the transfer of heat between the two components. Two thermally connected components may be in direct contact (e.g., without any intervening material). Two thermally connected components may have one or more thermal connectors between them. The thermal connector may be a thermally conductive material, or a material that facilitates the transfer of heat through its mass.

As used herein, a "cooling fluid" may be any fluid used in a cooling system. A cooling fluid may be used to cool a heat-generating component. In some embodiments, the cooling fluid is thermally connected to the heat-generating component. For example, a cooling fluid may be in direct contact with the heat-generating component. In some examples, the cooling fluid may be thermally connected to the heat-generating components through one or more thermal connectors, such as other cooling fluids and/or housings. The cooling fluid may be designed with specific properties. For example, the cooling fluid may have a boiling point that is determined based on operating parameters of the heat-generating component. A multi-phase cooling fluid may be configured to or designed to change phases (e.g., boil, freeze, sublime, condense) during absorption of the heat from the heat-generating component. A single-phase cooling fluid may be configured to or designed to stay a liquid during absorption of the heat from the heat-generating component.

FIG. 1 is a representation of a cooling system 100, according to at least one embodiment of the present disclosure. The cooling system 100 includes a tank 102. A tank cooling fluid 104 may be located in the tank 102. In some embodiments, the tank 102 is filled with the tank cooling fluid 104. For example, the tank 102 may be partially filled with the tank cooling fluid 104. In some examples, the tank 102 may be entirely filled with the tank cooling fluid 104.

The cooling system 100 includes a container 106. A container cooling fluid 108 may be located in the container 106. In some embodiments, the container 106 is filled with the container cooling fluid 108. For example, the container 106 may be partially filled with the container cooling fluid 108. In some examples, the container 106 may be entirely filled with the container cooling fluid 108.

The cooling system 100 includes a computing device 110. The computing device 110 may include one or more heat-generating components 112. During operating of the computing device 110, the heat-generating component 112 may generate heat. To cool the computing device 110 and/or the heat-generating component 112, the computing device 110 may be placed in the container 106. When placed in the container 106, the computing device 110 and/or the heat-generating component 112 may be at least partially submerged in the container cooling fluid 108.

In some embodiments, the heat-generating component 112 may be fully submerged in the container cooling fluid 108. The container cooling fluid 108 may be thermally connected with the heat-generating component 112. For example, the container cooling fluid 108 may be in direct contact with the heat-generating component 112. In some examples, the container cooling fluid 108 may be indirectly connected to the heat-generating component 112, such as through a covering or coating on the heat-generating component 112. Thermally connecting the container cooling fluid 108 with the heat-generating component 112 may cause heat from the heat-generating component 112 to be absorbed by the container cooling fluid 108.

The container 106 includes a container body 114. The container body 114 may form a chamber 116. The container body 114 may enclose the container cooling fluid 108 in the chamber 116. Put another way, the container cooling fluid 108 may be located in the chamber 116 of the container body 114. The chamber 116 may receive or be configured to receive the computing device 110 and/or the heat-generating component 112. The chamber 116 may receive the computing device 110 and/or the heat-generating component 112 based on a size and/or dimensions of the chamber 116. For example, the chamber 116 may have internal dimensions large enough for a particular computing device 110 and/or heat-generating component 112. In some examples, the computing device 110 may be a server device. In some examples, the computing device 110 may include a gaming device, a personal computer, any other computing device, and combinations thereof.

In accordance with at least one embodiment of the present disclosure, the container body 114 may absorb heat from the container cooling fluid 108 as (or after) the container cooling fluid 108 absorbs heat from the heat-generating component 112. Put another way, the heat generated by the heat-generating component 112 may be transferred to the container body 114 of the container 106 through or by the container cooling fluid 108.

As discussed herein, the container 106 may be located inside the tank 102. The container body 114 may be located in the tank cooling fluid 104. Put another way, the container body 114 may be at least partially submerged in the tank cooling fluid 104. The tank cooling fluid 104 may absorb heat from the container body 114. Put another way, the container body 114 may transfer heat to the tank cooling fluid 104. In this manner, as the container body 114 absorbs heat from the container cooling fluid 108 (which absorbed the heat from the heat-generating component 112), the tank cooling fluid 104 may absorb the heat from the container body 114. This may help to reduce the operating temperature of the heat-generating component 112.

As may be seen, the heat-generating component 112 may be thermally connected to one or more of the container cooling fluid 108, the container body 114, or the tank cooling fluid 104. In this manner, as the heat-generating component 112 generates heat, one or more of the container cooling fluid 108, the container body 114, and the tank cooling fluid 104 may absorb the heat to reduce or maintain the operating temperature of the heat-generating component 112.

As will be discussed in further detail herein, the tank cooling fluid 104 may remove the heat from the cooling system 100. For example, the tank cooling fluid 104 may transfer the heat to the atmosphere, to a remote heat sink, to a chiller, to any other location, and combinations thereof.

The container body 114 of the container 106 may be fluidly sealed. In this manner, when the container cooling fluid 108 is located in the container body 114, the container body 114 may prevent the container cooling fluid 108 from transferring out of the container body 114. The container body 114 may be sealed in any manner. For example, the container body 114 may be formed from two or more pieces that, when assembled form the chamber 116. The two or more pieces may be connected with a seal, such as a gasket, an O-ring, or other seal. This may fluidly seal the pieces, thereby reducing or preventing the container cooling fluid 108 from leaking out of the chamber 116. In some examples, the container body 114 may be formed from a single piece of material, with a chamber 116 being formed therein. This may help to reduce leaks of the container cooling fluid 108 through any seals or connections.

Reducing leaks of the container cooling fluid 108 may help to reduce contact of the container cooling fluid 108 with the operator, thereby improving the health and safety of the operator. Further, reducing leaks of the container cooling fluid 108 may help to reduce loss of the container cooling fluid 108 to the atmosphere. This may reduce the environmental impact of the container cooling fluid 108. In some embodiments, reducing loss of the container cooling fluid 108 to the atmosphere reduces the operating costs of the cooling system 100 by reducing the amount of the container cooling fluid 108 that is purchased and/or replaced.

In some embodiments, the container 106 is fluidly sealed such that gas and/or vapor may not enter or exit the chamber 116 of the container 106. During operation, the container cooling fluid 108 may at least partially evaporate and/or boil. The fluid seal of the chamber 116 may contain the released vapor and prevent the released vapor from exiting the chamber 116. This may further help to reduce fluid losses and/or reduce the amount of fluid vapor that may come into contact with an operator.

In some embodiments, the container 106 includes a pressure safety mechanism 118. The pressure safety mechanism 118 may be any type of pressure safety mechanism. For example, the pressure safety mechanism 118 may include a pressure-release valve, a burst disk, a rupture disk, any other type of pressure safety mechanism, and combinations thereof. The pressure safety mechanism 118 may have a release pressure. When the relative pressure between the interior of the chamber 116 and the exterior of the chamber 116 (e.g., the atmosphere, the tank cooling fluid 104) is less than the release pressure, then the pressure safety mechanism 118 may remain closed, and the container cooling fluid 108 may not be released through the pressure safety mechanism 118. When the relative pressure between the interior of the chamber 116 and the exterior of the chamber 116 is greater than the release pressure, then the pressure safety mechanism 118 may open and at least a portion of the pressure safety mechanism 118 may be released through the pressure safety mechanism 118.

In some embodiments, the release pressure may be in a range having an upper value, a lower value, or upper and lower values including any of 0 psi, 10 psi, 20 psi, 30 psi, 40 psi, 50 psi, 60 psi, 70 psi, 80 psi, 90 psi, 100 psi, 150 psi, or any value therebetween. For example, the release pressure may be greater than 0 psi (e.g., a vacuum). In another example, the release pressure may be less than 150 psi. In yet other examples, the release pressure may be any value in a range between 00 psi and 150 psi. In some embodiments, it may be critical that the release pressure is greater than 100 psi to improve the cooling capacity of the cooling system 100.

The chamber 116 may be fluidly sealed with a sealing pressure. The sealing pressure may be the pressure at which the container body 114 and/or the fluid seals between elements of the container body 114, including the sealed cable connection 120, may no longer be fluidly sealed. For example, if the pressure in the chamber 116 exceeds the sealing pressure, gases and/or the container cooling fluid 108 in the chamber 116 may leak through the seal. In some examples, if the pressure in the chamber 116 exceeds the sealing pressure, one or more of the fluid seals and/or the sealed cable connection 120 may be damaged. In some embodiments, the sealing pressure may be less than the release pressure of the pressure safety mechanism 118. In this manner, the pressure safety mechanism 118 may help to reduce damage to the container body 114 and/or the fluid seals in the container body 114 based on the pressure in the chamber 116.

As discussed herein, during operation, the heat from the heat-generating component 112 may increase the temperature of the container cooling fluid 108. Increasing the temperature of the container cooling fluid 108 may increase the pressure inside the chamber 116. For example, increasing the temperature of the container cooling fluid 108 may increase the vapor pressure and/or the evaporation rate of the container cooling fluid 108. This may increase the pressure of the interior of the chamber 116. In some examples, increasing the temperature of the container cooling fluid 108 may cause the container cooling fluid 108 to boil. Boiling the container cooling fluid 108 may increase the pressure of the interior of the chamber 116. In accordance with at least one embodiment of the present disclosure, a pressure safety mechanism 118 may help to reduce or prevent the pressure inside the chamber 116 from increasing to a level that may damage the chamber 116. In this manner, the pressure safety mechanism 118 may help to prevent the container cooling fluid 108 from leaking out of the container 106 unless the pressure increases to levels that may damage the container 106. This may help to prevent explosive decompression of the container 106. In some embodiments, the maximum pressure of the pressure safety mechanism 118 may be based on a maximum operating pressure of the electronic components inside the container 106, such as the computing device 110 and other electronic components. This may help to reduce damage to the electronic components based on over-pressuring the electronic components.

In some embodiments, the chamber 116 is partially filled with the container cooling fluid 108. An expansion portion of the chamber 116 may be filled with atmospheric gases. As the temperature of the container cooling fluid 108 increases, the pressure of the expansion portion may increase and the atmospheric gases may compress. The pressure of the expansion portion may further increase based on the presence of gaseous container cooling fluid 108. In this manner, the expansion portion may allow for increased pressure of the chamber 116. In some embodiments, the expansion portion is vacuum-sealed. As the temperature of the container cooling fluid 108 increases, the expansion portion may fill with gaseous container cooling fluid 108 and the pressure may increase as the temperature increases and/or as more of the container cooling fluid 108 expands into a gaseous form (e.g., through boiling or an increase in the vapor pressure).

In some embodiments, the pressure safety mechanism 118 is located below a surface of the tank cooling fluid 104. Put another way, the pressure safety mechanism 118 may be submerged in the tank cooling fluid 104. If the pressure safety mechanism 118 releases, then the container cooling fluid 108 may be released into the tank cooling fluid 104. This may cause the container cooling fluid 108 to mix with the tank cooling fluid 104, thereby reducing the amount of gaseous container cooling fluid 108 released into the atmosphere. In some embodiments, the pressure safety mechanism 118 is located above the surface of the tank cooling fluid 104. This may help to reduce or prevent contamination of the tank cooling fluid 104 with the container cooling fluid 108.

In some embodiments, the container 106 may include a sealed cable connection 120. The sealed cable connection 120 may be located on the chamber 116 and allow a cable 122, such as a power cable and/or a communication cable, to pass into the chamber 116. The cable 122 may be connected to the computing device 110 to provide power and/or communication to the computing device 110. For example, the cable 122 may provide power to the computing device 110. In some examples, the cable 122 may provide communication to the computing device 110. In some examples, the cable 122 may provide both power and communication to the computing device 110. The sealed cable connection 120 may create a fluid seal at the container body 114 into the chamber 116. This may allow the cable 122 to pass through the container body 114 and provide power and/or communication to the computing device 110 without allowing the tank cooling fluid 104 to pass into the chamber 116. In this manner, the container 106 may be submerged without any of the tank cooling fluid 104 leaking into the chamber 116. This may allow the computing device 110 to receive power and communication during operation.

As discussed herein, the container cooling fluid 108 may be any type of cooling fluid. For example, the container cooling fluid 108 may be a single-phase cooling fluid. Put another way, the container cooling fluid 108 may be a cooling fluid that has a boiling point of greater than an operating temperature of the heat-generating component 112. This may help to reduce the pressure inside the chamber 116 of the container body 114.

In some examples, the container cooling fluid 108 may be a multi-phase cooling fluid. A multi-phase container cooling fluid 108 may have a boiling temperature that is at or approximately at the operating temperature of the heat-generating component 112. This may allow the container cooling fluid 108 to absorb more heat to provide the energy for the change in phase (e.g., the heat of vaporization) between a liquid container cooling fluid 108 and a gas container cooling fluid 108. This may increase the heat absorption capacity of the container cooling fluid 108. As the container cooling fluid 108 boils and the temperature of the chamber 116 increases, the container body 114 may absorb some of the heat from the container cooling fluid 108. This may cause the gaseous container cooling fluid 108 to condense, thereby reducing the pressure within the chamber 116.

In some embodiments, the boiling point of the container cooling fluid 108 may be in a range having an upper value, a lower value, or upper and lower values including any of −20° C., −10° C., 0° C., 10° C., 20° C., 30° C., 35° C., 40° C., 45° C., 50° C., 55° C., 60° C., 65° C., 70° C., 80° C., 90° C., 100° C., or any value therebetween. For example, the boiling point of the container cooling fluid 108 may be greater than −20° C. In another example, the boiling point of the container cooling fluid 108 may be less than 100° C. In yet other examples, the boiling point of the container cooling fluid 108 may be any value in a range between −20° C. and 100° C. In some embodiments, it may be critical that the boiling point of the container cooling fluid 108 is between 40° C. and 60° C. to maintain the heat-generating component 112 at its operating temperature. In some embodiments, the operating temperature of the computing device may be between 40° C. at 14 psi and 60° C. at 22 psi.

In some embodiments, the container cooling fluid 108 may be different than the tank cooling fluid 104. This may allow the container cooling fluid 108 to be designed with different properties than the tank cooling fluid 104. In this manner, the container cooling fluid 108 may be tailored to the purpose of direct contact with the heat-generating component 112 while the tank cooling fluid 104 may be tailored to improve ease of handling, price, environmental considerations, any other factor, and combinations thereof.

As discussed herein, the container body 114 may transfer the absorbed heat to the tank cooling fluid 104, thereby cooling the container body 114 and allowing the container body 114 to continue to cool the container cooling fluid 108. In some embodiments, the cooling system 100 may reach an equilibrium of operating temperature of the heat-generating component 112, temperature of the container cooling fluid 108, pressure of the chamber 116, and the temperature of the chamber 116. In some embodiments, the release pressure of the pressure safety mechanism 118 may be set to be above the equilibrium operating pressure of the chamber 116 based on the operating temperature of the heat-generating component 112, temperature of the container cooling fluid 108, pressure of the chamber 116, and temperature of the chamber 116.

The tank cooling fluid 104 may be any type of cooling fluid. For example, the tank cooling fluid 104 may be a single-phase cooling fluid. Put another way, the boiling point of the tank cooling fluid 104 may be greater than the operating temperature of the container body 114. In this manner, the tank cooling fluid 104 may absorb heat from the tank cooling fluid 104 without boiling or excessive fluid loss due to evaporation and/or boiling. In some embodiments, the single-phase cooling fluid may boil if the cooling system 100 enters an emergency mode, such as if the 100// goes offline. Boiling the single-phase cooling fluid may help to prevent the interior of the container 106 from becoming too hot and damaging the electronic components.

In some embodiments, the tank cooling fluid 104 is a cheap, commonly available fluid. For example, the tank cooling fluid 104 may include water or a water-based fluid. In some embodiments, the tank cooling fluid 104 may include unprocessed, or tap water. In some embodiments, the tank cooling fluid 104 may include an oil-based fluid, such as mineral oil. Because the tank cooling fluid 104 is not in contact with the computing device 110 and/or the heat-generating component 112, the tank cooling fluid 104 may not be specifically engineered to reduce or prevent damage to the computing device 110 and/or heat-generating component 112. This may allow the tank cooling fluid 104 to be a cheap, easily sourced, and non-harmful fluid, such as water or a water-based fluid. Indeed, water has a high heat capacity, which may help to improve the heat absorbing capacity of the cooling system 100. In some embodiments, the tank cooling fluid 104 may be any other type of fluid.

The tank 102 may be any type of tank. For example, the tank 102 may include a self-contained tank that is located in a datacenter or other dedicated computing center. In some examples, the tank 102 may include a tank for a home-computing system. In some examples, the tank 102 may be a swimming pool. In some examples, the tank 102 may be a pond, a stream, or other natural body of water.

Figure 2:
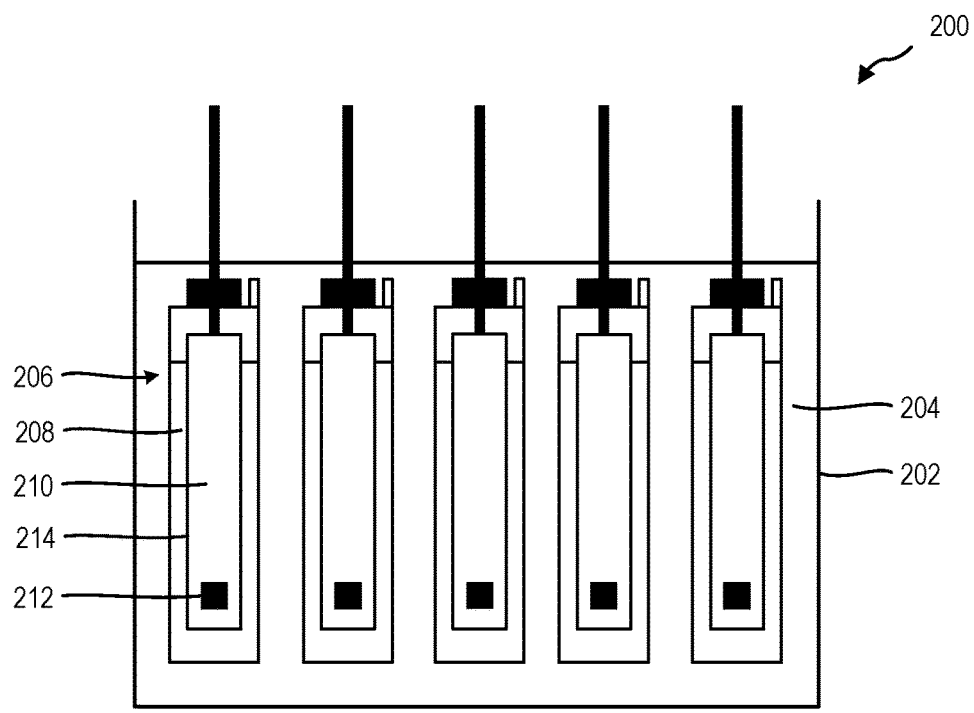
FIG. 2 is a representation of a cooling system including a plurality of containers, according to at least one embodiment of the present disclosure.

FIG. 2 is a representation of a cooling system 200 including a plurality of containers 206, according to at least one embodiment of the present disclosure. The cooling system 200 includes a tank 202. The tank 202 may be at least partially filled with a tank cooling fluid 204. A plurality of containers 206 may be placed in the tank 202. Each of the containers 206 may be at least partially submerged in the tank cooling fluid 204.

The containers 206 may receive a computing device 210 having a heat-generating component 212. The containers 206 may be at least partially filled with a container cooling fluid 208. The multiple computing devices 210 and/or the heat-generating components 212 may be located inside the containers 206 and be at least partially submerged in the container cooling fluid 208. During operation, the heat-generating component 212 may generate heat. The container cooling fluid 208 may absorb the generated heat, which may be transferred to a container body 214 of the container 206. The container body 214 may transfer the absorbed heat to the tank cooling fluid 204. In this manner, the cooling system 200 may provide cooling for multiple computing devices 210 and/or heat-generating components 212.

Conventionally, a computing device may be directly placed in the tank 202. The tank cooling fluid 204 may be in contact with multiple computing devices 210. As discussed herein, placing the computing devices directly in the tank cooling fluid 204 may result in a tank cooling fluid 204 that is designed to be in contact with the computing devices, which may result in losses of the tank cooling fluid 204 during operation and/or present a health and safety hazard to the operator.

Utilizing the containers 206 may allow the container cooling fluid 208 to be in contact with the multiple computing devices 210 with the container body 214 in contact with the tank cooling fluid 204, thereby reducing losses of the container cooling fluid 208 and/or reducing or preventing contact of the container cooling fluid 208 with the operator. Operating the cooling system 200 without the containers 206 may allow the tank 202 to house more computing devices than operating the cooling system 200 with the containers 206. This may be because the container body 214 plus the multiple computing devices 210 has a greater width than the multiple computing devices 210 alone, thus making the containers 206 occupy more space within the tank 202. But utilizing the containers 206 may help to increase the operating efficiency, lower operating costs through losses of the container cooling fluid 208, lower operating costs through reduced operator contact with the container cooling fluid 208, and combinations thereof.

Figure 3:
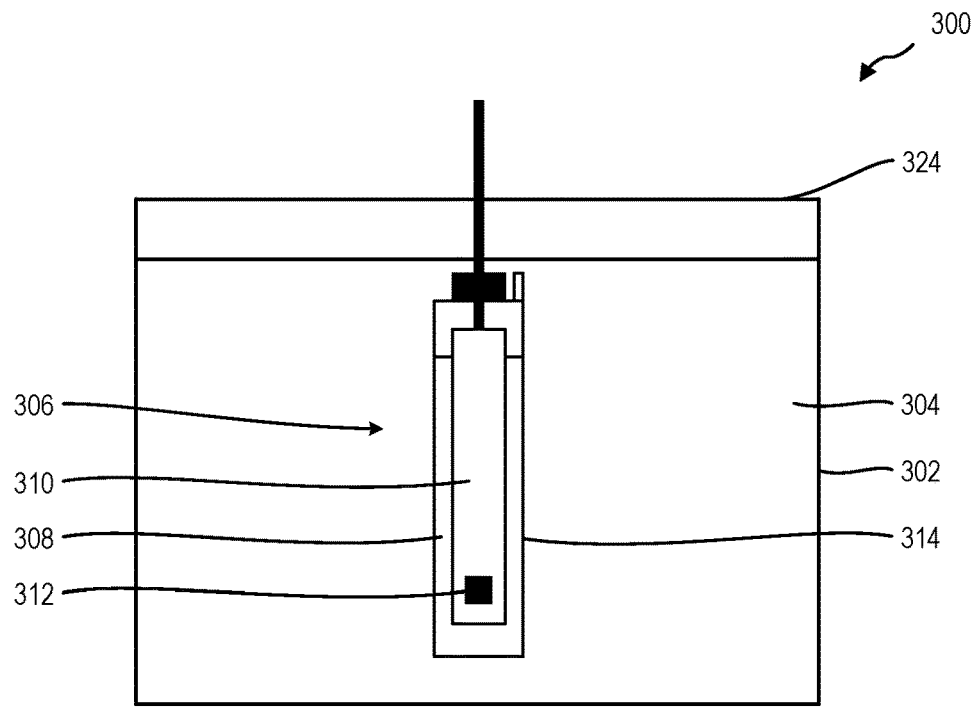
FIG. 3 is a representation of a cooling system having a container located in a tank, according to at least one embodiment of the present disclosure.

FIG. 3 is a representation of a cooling system 300 having a container 306 located in a tank 302, according to at least one embodiment of the present disclosure. The container 306 may receive a computing device 310 having a heat-generating component 312. The container 306 may be at least partially filled with a container cooling fluid 308. The multiple computing devices 310 and/or the heat-generating components 312 may be located inside the containers 306 and be at least partially submerged in the container cooling fluid 308. During operation, the heat-generating component 312 may generate heat. The container cooling fluid 308 may absorb the generated heat, which may be transferred to a container body 314 of the container 306. The container body 314 may transfer the absorbed heat to the tank cooling fluid 304.

In the embodiment shown, the tank 302 is enclosed. The tank 302 may include a tank cover 324. The tank cover 324 may enclose the interior of the tank 302. As the tank cooling fluid 304 is heated from the container body 314, the tank cooling fluid 304 may begin to evaporate. Covering the tank 302 with the tank cover 324 may help to reduce or prevent fluid loss of the tank cooling fluid 304 from the tank 302. This may help to reduce operating costs and/or reduce exposure of the tank cooling fluid 304 to the operator.

In some embodiments, covering or closing the tank 302 with the tank cover 324 may help to prevent contaminants from entering the tank cooling fluid 304. For example, the tank 302 may be a natural body of water, and covering the tank 302 may help to keep dirt, debris, leaves, bugs, and other contaminants out of the tank cooling fluid 304.

In some embodiments, the tank cover 324 may be removable. For example, the tank cover 324 may be removed to access the container 306 and/or the computing device 310 within the container 306. In some embodiments, the tank cover 324 may be removable to access and/or maintain or replace the tank cooling fluid 304.

Figure 4:
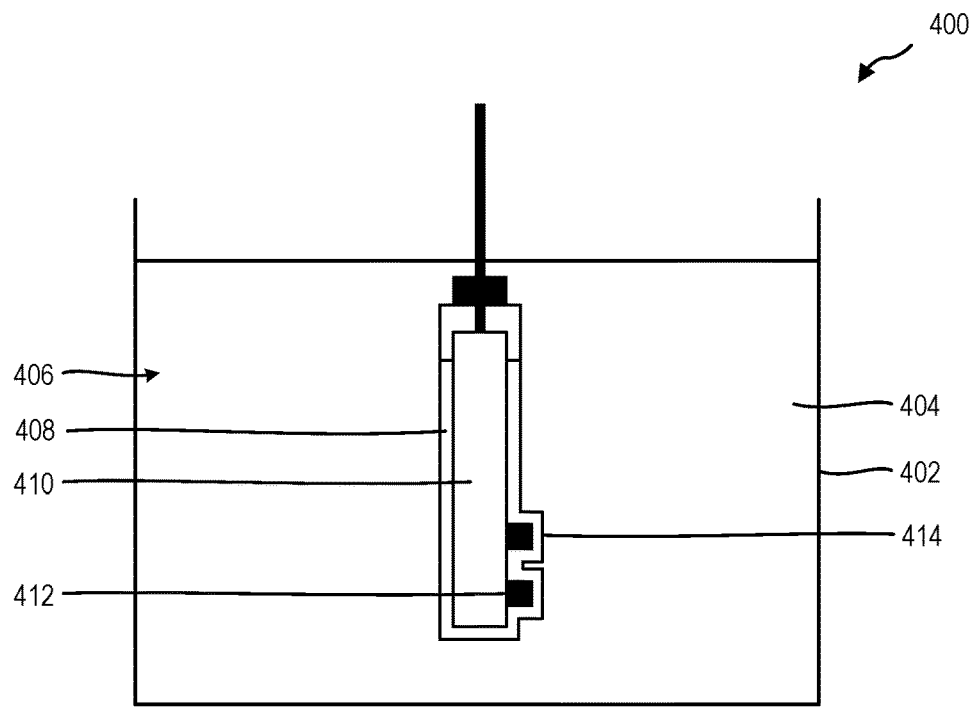
FIG. 4 is a representation of a cooling system having a container located in a tank, according to at least one embodiment of the present disclosure.

FIG. 4 is a representation of a cooling system 400 having a container 406 located in a tank 402, according to at least one embodiment of the present disclosure. The container 406 may receive a computing device 410 having a heat-generating component 412. The container 406 may be at least partially filled with a container cooling fluid 408. The multiple computing devices 410 and/or the heat-generating components 412 may be located inside the containers 406 and be at least partially submerged in the container cooling fluid 408. During operation, the heat-generating component 412 may generate heat. The container cooling fluid 408 may absorb the generated heat, which may be transferred to a container body 414 of the container 406. The container body 414 may transfer the absorbed heat to the tank cooling fluid 404.

The computing device 410 has a device profile. The device profile may be the 3-dimensional outer profile of the computing device 410, which may include the shape of the printed circuit board (PCB) and any protruding structures, such as the heat-generating component 412 and any other protruding structures. The container body 414 has a body profile. In accordance with at least one embodiment of the present disclosure, the body profile of the container body 414 may be complementary to the device profile of the computing device 410. Put another way, the container 406 has a body profile that may be complementary to a device profile of the computing device 410. For example, the container body 414 may include one or more ridges, valleys, protrusions, or other surface features that match the shape of the PCB and the protruding structures. In this manner, complementary profiles may allow the shape of the container body 414 to match the shape of the computing device 410.

The container body 414 may be offset from the surface of the computing device 410. The container cooling fluid 408 may fill the gap or the void space between the container body 414 and the computing device 410. In some embodiments, the container body 414 may be offset from the computing device 410 with the same distance across the device profile. In accordance with at least one embodiment of the present disclosure, having a body profile of the container body 414 that is complementary to the device profile of the computing device 410 may help to reduce the amount of container cooling fluid 408 that may be used. In some embodiments, having a body profile of the container body 414 that is complementary to the device profile of the computing device 410 may help to improve or increase the heat transfer from the heat-generating component 412 to the tank cooling fluid 404. In this manner, the complementary profiles may help to improve the cooling capacity of the cooling system 400.

Figure 5:
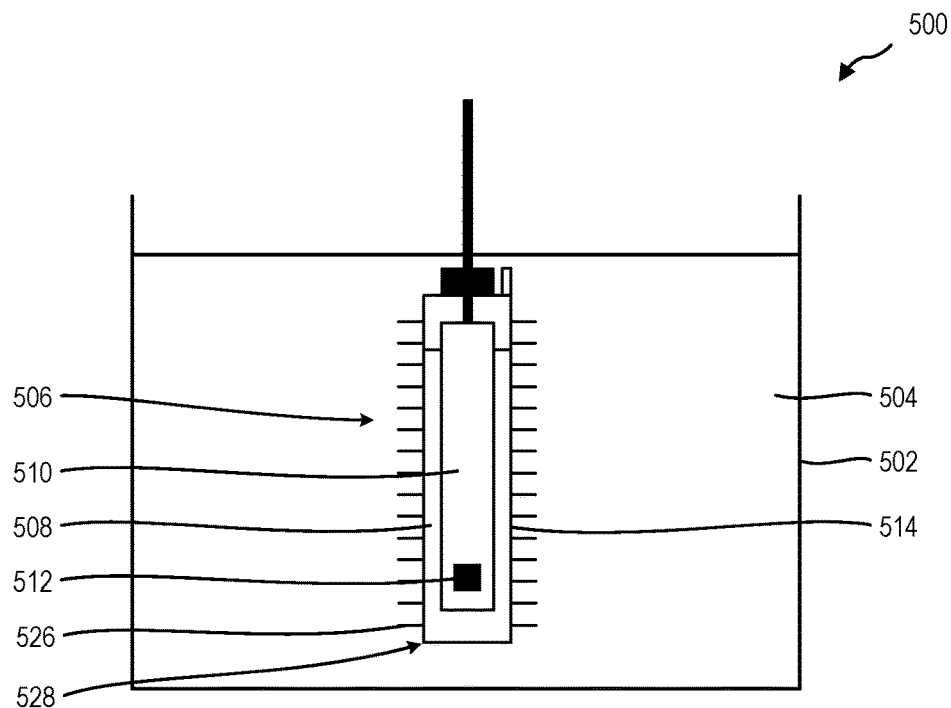
FIG. 5 is a representation of a cooling system having a container located in a tank, according to at least one embodiment of the present disclosure.

FIG. 5 is a representation of a cooling system 500 having a container 506 located in a tank 502, according to at least one embodiment of the present disclosure. The container 506 may receive a computing device 510 having a heat-generating component 512. The container 506 may be at least partially filled with a container cooling fluid 508. The multiple computing devices 510 and/or the heat-generating components 512 may be located inside the containers 506 and be at least partially submerged in the container cooling fluid 508. During operation, the heat-generating component 512 may generate heat. The container cooling fluid 508 may absorb the generated heat, which may be transferred to a container body 514 of the container 506. The container body 514 may transfer the absorbed heat to the tank cooling fluid 504.

In the embodiment shown, the container body 514 includes one or more fins 526. The fins 526 may extend outward from an outer surface 528 of the container body 514. The fins 526 may be thermally connected to the container body 514. The fins 526 may absorb the heat transferred to the container body 514. The fins 526 may extend into the tank cooling fluid 504. The larger surface area of the fins 526 may allow the heat absorbed by the container body 514 to be more efficiently transferred to the tank cooling fluid 504. In this manner, the fins 526 may help to further improve or increase the heat absorbing properties of the cooling system 500.

In some embodiments, the fins 526 may be integrally formed with the container body 514. This may help to improve the thermal connection to the container body 514. In some embodiments, the fins 526 may be separately formed from the container body 514 and thermally connected to the outer surface 528 of the container body 514, such as through an adhesive and/or other connection.

Figure 6:
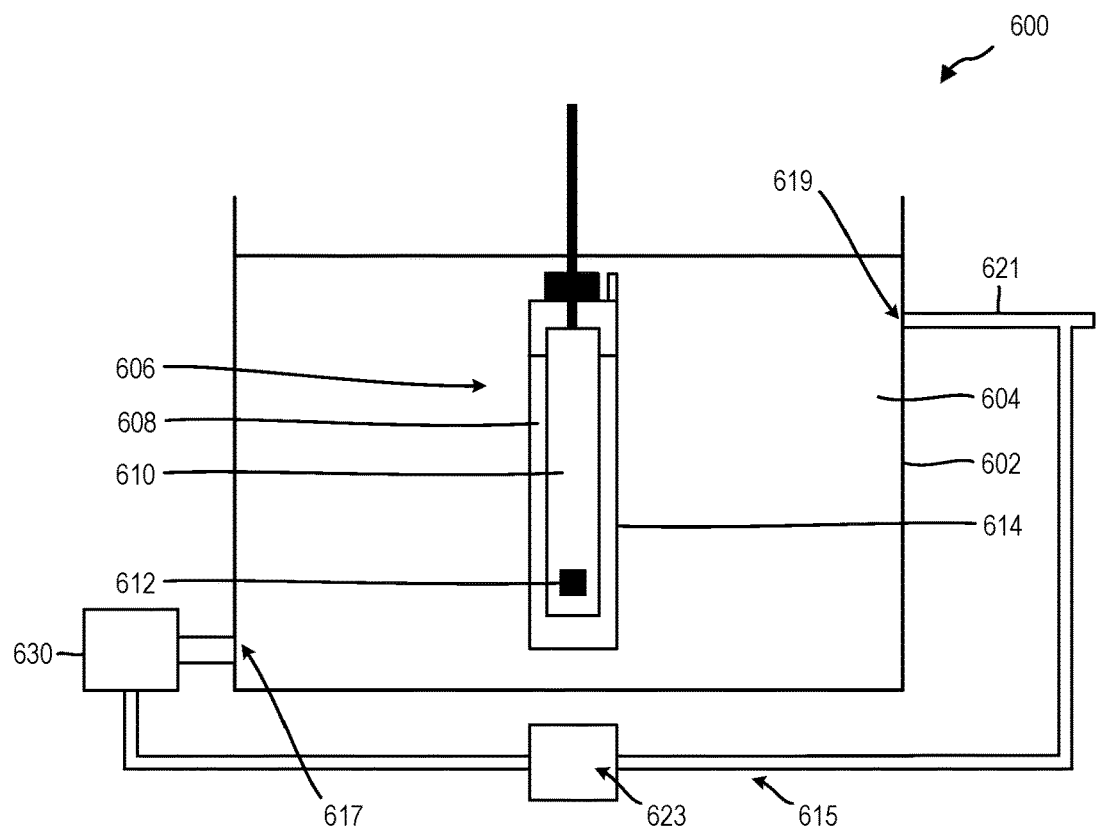
FIG. 6 is a representation of a cooling system having a container located in a tank, according to at least one embodiment of the present disclosure.

FIG. 6 is a representation of a cooling system 600 having a container 606 located in a tank 602, according to at least one embodiment of the present disclosure. The container 606 may receive a computing device 610 having a heat-generating component 612. The container 606 may be at least partially filled with a container cooling fluid 608. The multiple computing devices 610 and/or the heat-generating components 612 may be located inside the containers 606 and be at least partially submerged in the container cooling fluid 608. During operation, the heat-generating component 612 may generate heat. The container cooling fluid 608 may absorb the generated heat, which may be transferred to a container body 614 of the container 606. The container body 614 may transfer the absorbed heat to the tank cooling fluid 604.

In some embodiments, the tank cooling fluid 604 forms a heat sink. For example, the mass of the tank cooling fluid 604 may be such that the heat generated by the heat-generating component 612 may not have an impact on the temperature or heat absorption capacity of the tank cooling fluid 604. For example, the tank cooling fluid 604 may have sufficient mass that the heat transferred to the tank cooling fluid 604 by the heat-generating component 612 may not appreciably raise the temperature of the tank cooling fluid 604.

In some embodiments, the tank cooling fluid 604 releases heat to the surroundings at a rate that is equal to or less than the heat generation of the heat-generating component 612. For example, the tank cooling fluid 604 may release heat to the atmosphere at a rate that is the same as or greater than the heat generation of the heat-generating component 612. In some examples, the tank cooling fluid 604 may be buried, and the tank cooling fluid 604 may release heat to the ground at a rate that is equal to or less than the heat generation of the heat-generating component 612.

In accordance with at least one embodiment of the present disclosure, the cooling system 600 includes a tank fluid circulation system 615. The tank fluid circulation system 615 may circulate the tank cooling fluid 604 through the tank 602. This may help to remove the heat transferred to the tank cooling fluid 604 out of the cooling system 600. Cold fluid may enter the tank 602 to absorb heat from the container body 614. Fluid may enter the tank 602 through an inlet 617 and exit the tank 602 through an outlet 619.

In some embodiments, the tank fluid circulation system 615 may include a fluid pump 630. The fluid pump 630 may be fluidly connected to the interior of the tank 602. For example, the fluid pump 630 may be fluidly connected to the inlet 617. In some embodiments, the fluid pump 630 may circulate the tank cooling fluid 604 within the tank 602 to evenly spread the heat transfer from the container body 614 to the tank cooling fluid 604. For example, convection currents generated in the tank cooling fluid 604 may be insufficient to circulate the tank cooling fluid 604 away from the container body 614, and the fluid pump 630 may help to circulate fluid within the tank 602. This may help to improve the heat transfer from the container body 614 to the tank cooling fluid 604.

In some embodiments, the tank cooling fluid 604 may exit the tank 602 through the outlet 619 to a circulation pipe 621. The circulation pipe 621 may direct the tank cooling fluid 604 to one or more different location. For example, the circulation pipe 621 may direct the tank cooling fluid 604 to be cooled at a separate location, such as a cooling tank, a heat exchanger 623, a chiller, any other cooling location, and combinations thereof. In some embodiments, the circulation pipe 621 may direct the cooled tank cooling fluid 604 back to into the tank 602. For example, the circulation pipe 621 may direct the cooled tank cooling fluid 604 to the fluid pump 630, and the fluid pump 630 may pump the cooled tank cooling fluid 604 back into the tank 602. This may result in a closed-loop cooling system.

In some examples, the circulation pipe 621 may direct the warmed tank cooling fluid 604 to be used in another industrial process. In some examples, the circulation pipe 621 may discharge the warmed tank cooling fluid 604. In some embodiments, a portion of the tank cooling fluid 604 may be directed away from the tank 602 and a portion of the tank cooling fluid 604 may be recirculated back into the tank 602.

Figure 7:
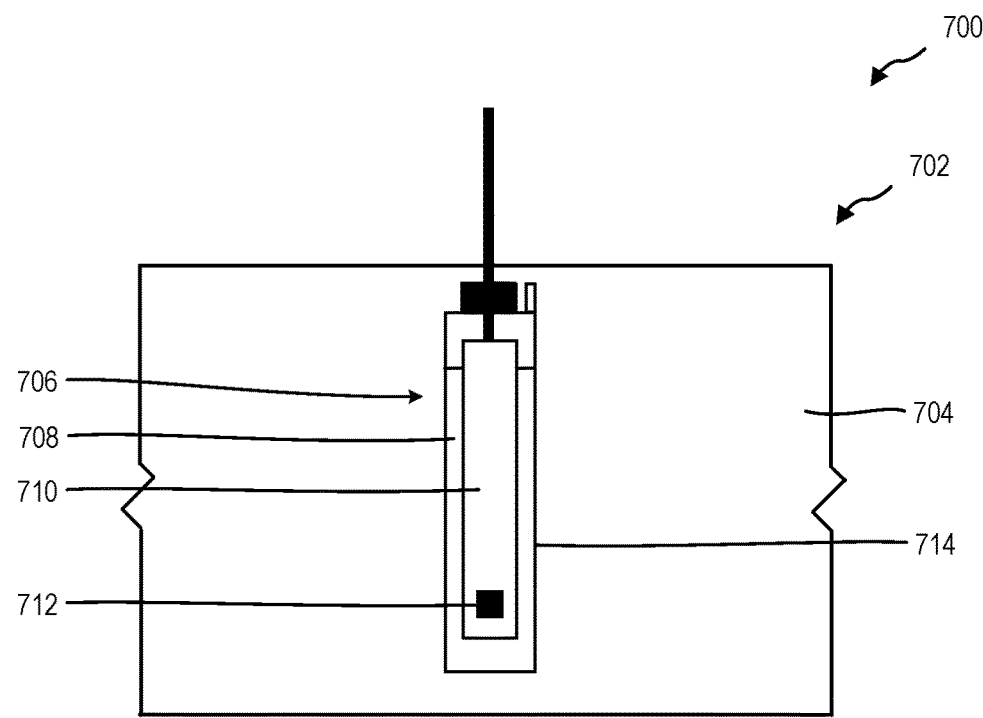
FIG. 7 is a representation of a cooling system having a container located in a body of water, according to at least one embodiment of the present disclosure.

FIG. 7 is a representation of a cooling system 700 having a container 706 located in a tank 702, according to at least one embodiment of the present disclosure. The container 706 may receive a computing device 710 having a heat-generating component 712. The container 706 may be at least partially filled with a container cooling fluid 708. The multiple computing devices 710 and/or the heat-generating components 712 may be located inside the containers 706 and be at least partially submerged in the container cooling fluid 708. During operation, the heat-generating component 712 may generate heat. The container cooling fluid 708 may absorb the generated heat, which may be transferred to a container body 714 of the container 706. The container body 714 may transfer the absorbed heat to the tank cooling fluid 704.

In accordance with at least one embodiment of the present disclosure, the tank 702 may be any type of tank 702. For example, the tank 702 may be an open body of water, such as a river, lake, or the ocean. In some examples, the tank 702 may be a man-made body of water, such as a swimming pool or other man-made body of water. The container 706 may be submerged in the open body of water, and the natural flow of the open body of water may cool the container 706. In some embodiments, natural bodies of water may represent large thermal reservoirs, and be able to absorb a large amount of heat from the container 706. In this manner, the cooling system 700 may have flexibility regarding where to place the container 706.

Figure 8:
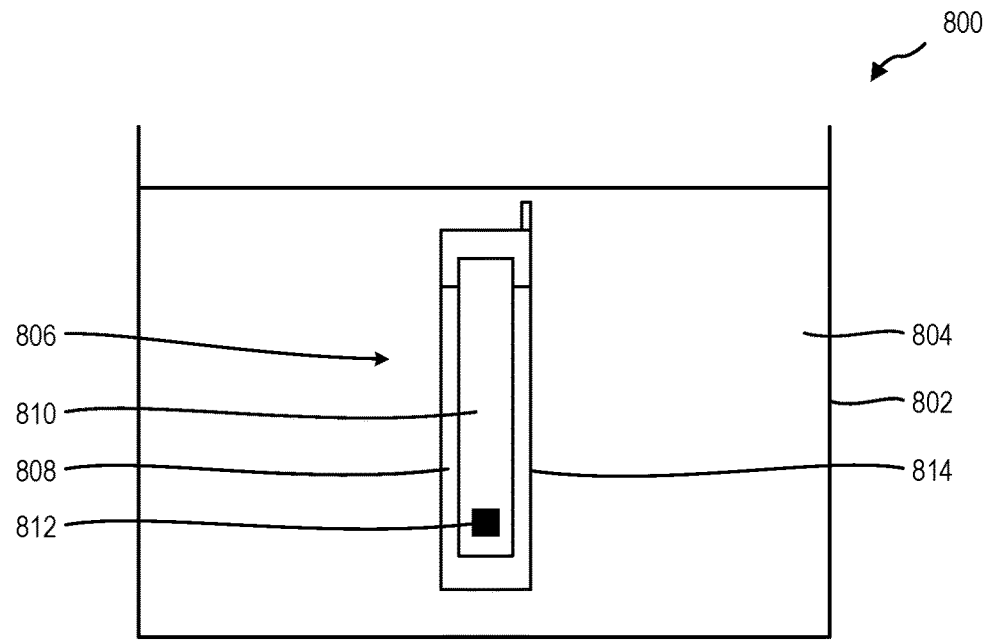
FIG. 8 is a representation of a cooling system having a container located in a tank, according to at least one embodiment of the present disclosure.

FIG. 8 is a representation of a cooling system 800 having a container 806 located in a tank 802, according to at least one embodiment of the present disclosure. The container 806 may receive a computing device 810 having a heat-generating component 812. The container 806 may be at least partially filled with a container cooling fluid 808. The multiple computing devices 810 and/or the heat-generating components 812 may be located inside the containers 806 and be at least partially submerged in the container cooling fluid 808. During operation, the heat-generating component 812 may generate heat. The container cooling fluid 808 may absorb the generated heat, which may be transferred to a container body 814 of the container 806. The container body 814 may transfer the absorbed heat to the tank cooling fluid 804.

In the embodiment shown in FIG. 8, the computing device 810 may include one or more wireless components. For example, the computing device may not include a power and/or communication cable. The computing device 810 may include a wireless communication system, such as Wi-Fi, Bluetooth, cellular, or other wireless communication system. In some embodiments, the computing device 810 may include a wireless power system. For example, the computing device may receive power through wireless induction power transfer. This may allow the container 806 to not include a power and/or communication cable. This may help to reduce leaks and/or ingress of the tank cooling fluid into the interior of the container body 814.

Figure 9:
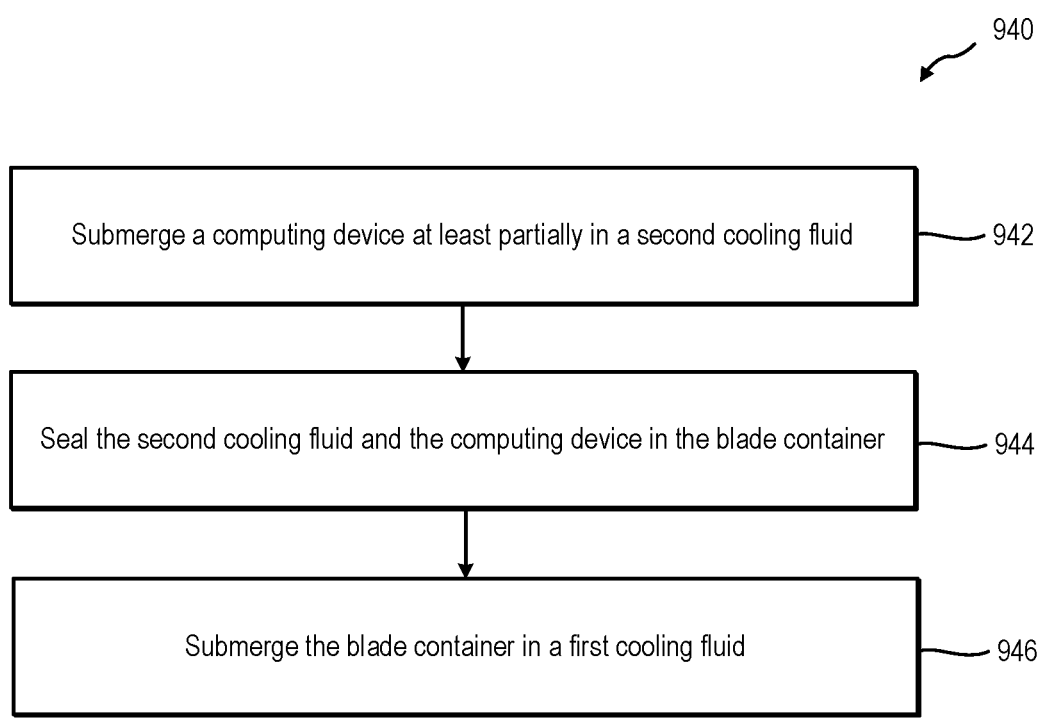
FIG. 9 is a flowchart of a method for cooling a computing device, according to at least one embodiment of the present disclosure.

FIG. 9, the corresponding text, and the examples provide a number of different methods, systems, devices, and non-transitory computer-readable media of the cooling system. In addition to the foregoing, one or more embodiments can also be described in terms of flowcharts comprising acts for accomplishing a particular result, as shown in FIG. 9. FIG. 9 may be performed with more or fewer acts. Further, the acts may be performed in differing orders. Additionally, the acts described herein may be repeated or performed in parallel with one another or parallel with different instances of the same or similar acts.

As mentioned, FIG. 9 illustrates a flowchart of a method 940 of a series of acts for cooling a computing system, according to at least one embodiment of the present disclosure. While FIG. 9 illustrates acts according to one embodiment, alternative embodiments may omit, add to, reorder, and/or modify any of the acts shown in FIG. 9. The acts of FIG. 9 can be performed as part of a method.

A computing device may be submerged at least partially in a container cooling fluid at 942. The computing device may be placed in a container. A chamber in the container may be filled with the container cooling fluid. The computing device may include a heat-generating component. When the computing device is submerged in the container cooling fluid, the heat-generating component may be at least partially submerged in the container cooling fluid.

The container cooling fluid and the computing device may be sealed in the container at 944. After the computing device is at least partially submerged in the container cooling fluid, the container may be shut. A lid or other element may be closed over the chamber in the container. The lid may be sealed, thereby sealing the container cooling fluid and the computing device in the container. This may help to reduce or prevent the container cooling fluid from exiting the chamber in the container.

The container may be submerged in a tank cooling fluid located in a tank at 946. The tank may be filled with the tank cooling fluid. The tank cooling fluid may be different than the container cooling fluid. During operation, the heat-generating component may generate heat. The container cooling fluid may absorb the heat, which may then be transferred to the container body of the container. Because the container body is submerged in the tank cooling fluid, the heat absorbed by the container may be transferred to the tank cooling fluid.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A cooling system for a computing device, comprising:
   a tank filled with a first cooling fluid; and
   a container including a container body, a chamber, and a pressure safety mechanism, the chamber receiving a heat-generating component, the container being sealed, the container being at least partially submerged in the first cooling fluid in the tank, the container including a second cooling fluid, and wherein the pressure safety mechanism is located above a surface of the first cooling fluid allowing the second cooling fluid to be released above the surface of the first cooling fluid when the pressure safety mechanism is released.

2. The cooling system of claim 1, wherein the container is sealed with a sealing pressure that is less than a release pressure of the pressure safety mechanism.

3. The cooling system of claim 1, wherein the pressure safety mechanism includes a pressure-release valve or a burst disk.

4. The cooling system of claim 1, wherein the heat-generating component is submerged in the second cooling fluid.

5. The cooling system of claim 1, wherein the second cooling fluid has a boiling point of between −20° C. and 100° C.

6. The cooling system of claim 1, wherein the container includes a sealed cable connection to at least one of power or communication to the heat-generating component.

7. The cooling system of claim 1, wherein the first cooling fluid is different from the second cooling fluid.

8. The cooling system of claim 1, wherein the first cooling fluid is water.

9. A cooling system, comprising:
   a computing device including at least one heat-generating component;
   a tank filled with a first cooling fluid; and
   a container including a chamber and a pressure safety mechanism, the chamber being at least partially filled with a second cooling fluid and at least partially filled with atmospheric gases, the container being at least partially submerged in the first cooling fluid, the pressure safety mechanism located below a surface of the first cooling fluid allowing the second cooling fluid to be released into the first cooling fluid when the pressure safety mechanism is released, and wherein the computing device is located in the container, the computing device being at least partially submerged in the second cooling fluid.

10. The cooling system of claim 9, wherein the container has a body profile complementary to a device profile of the computing device.

11. The cooling system of claim 9, wherein the first cooling fluid is different from the second cooling fluid.

12. The cooling system of claim 9, wherein the second cooling fluid has a boiling point approximately within an operating temperature of the computing device.

13. The cooling system of claim 9, wherein the pressure safety mechanism has a release pressure of between 0 and 147 psi.

14. The cooling system of claim 9, wherein the container includes at least one of a wireless power connection or a wireless communication system.

15. A method for cooling a computing device, comprising:
submerging a container in a first cooling fluid, the first cooling fluid located in a tank, the container including a pressure safety mechanism located above a surface of the first cooling fluid;
submerging a computing device at least partially in a second cooling fluid, the second cooling fluid being located in the container together with atmospheric gases;
sealing the second cooling fluid, and the computing device in the container; and
releasing the second cooling fluid above the surface of the first cooling fluid when the pressure safety mechanism is released without contaminating the first cooling fluid with the second cooling fluid.

16. The method of claim 15, further comprising operating the computing device while the computing device is at least partially submerged in the second cooling fluid.

17. The method of claim 16, wherein operating the computing device includes operating the computing device at an operating temperature that is approximately the same as a boiling point of the second cooling fluid.

18. The method of claim 15, further comprising providing power to the computing device through a sealed cable connection.

* * * * *